(12) United States Patent
Bauer et al.

(10) Patent No.: US 8,461,636 B2
(45) Date of Patent: Jun. 11, 2013

(54) FERROIC SENSOR HAVING TINI-FILM FIELD-EFFECT TRANSISTOR AND FERROIC LAYER APPLIED TO SUBSTRATE

(75) Inventors: Siegfried Bauer, Linz (AT); Ingrid Graz, Linz (AT); Reinhard Schwödiauer, Linz (AT); Christoph Keplinger, Wilhering (AT); Martin Kaltenbrunner, Linz (AT); Stéphanie Perichon Lacour, Cottenham (GB); Sigurd Wagner, Princeton, NJ (US)

(73) Assignee: Universität Linz, Linz (AT)

( * ) Notice: Subject to any disclaimer, the term of this patent is extended or adjusted under 35 U.S.C. 154(b) by 910 days.

(21) Appl. No.: 12/223,241

(22) PCT Filed: Jan. 25, 2007

(86) PCT No.: PCT/AT2007/000032
§ 371 (c)(1),
(2), (4) Date: Sep. 24, 2008

(87) PCT Pub. No.: WO2007/085035
PCT Pub. Date: Aug. 2, 2007

(65) Prior Publication Data
US 2010/0224919 A1 Sep. 9, 2010

(30) Foreign Application Priority Data
Jan. 26, 2006 (AT) .................................. A 114/2006

(51) Int. Cl.
*H01L 21/02* (2006.01)
*H01L 29/786* (2006.01)

(52) U.S. Cl.
USPC ........................................ 257/295

(58) Field of Classification Search
USPC ........................................ 257/295
See application file for complete search history.

(56) References Cited

U.S. PATENT DOCUMENTS
6,031,269 A 2/2000 Liu
(Continued)

FOREIGN PATENT DOCUMENTS
DE 38 23 901 2/1990
WO WO 2005/008125 1/2005

OTHER PUBLICATIONS

International Search Report.
Lindner, M. et al., "Charged Cellular Polymers with "Ferroelectretic" Behavior," IEEE Transactions on Dielectrics and Electrical Insulation, Apr. 2004, vol. 11, No. 2, pp. 255-263. (Austrian priority application).

(Continued)

*Primary Examiner* — Ha Tran T Nguyen
*Assistant Examiner* — Raj R Gupta
(74) *Attorney, Agent, or Firm* — Collard & Roe, P.C.

(57) ABSTRACT

A ferroic component is described, comprising a ferroic layer (10) arranged between two electrodes (12,13), a thin-film field-effect transistor (4) whose gate electrode (3) forms one of the two electrodes (12, 13) of the ferroic layer (10) which is joined to the gate electrode (3) via an intermediate layer (11) acting as a bonding agent, and a substrate that is used as a support. In order to obtain a flexible component it is proposed that the thin-film field-effect transistor (4) on the one hand and the ferroic layer (10) which consists of an internally charged cellular polymer on the other hand are applied to the substrate which is arranged as a flexible plastic film (1), optionally by interposing an insulating layer (2) therebetween.

5 Claims, 1 Drawing Sheet

U.S. PATENT DOCUMENTS

| | | |
|---|---|---|
| 6,916,679 B2 | 7/2005 | Snyder et al. |
| 2004/0217401 A1* | 11/2004 | Sakai et al. .................. 257/295 |
| 2005/0020002 A1 | 1/2005 | Yamazaki et al. |
| 2005/0087870 A1* | 4/2005 | Adetutu et al. ............... 257/751 |
| 2006/0091394 A1* | 5/2006 | Honda ............................ 257/66 |

OTHER PUBLICATIONS

Gelinck, G. H. et al., "All-polymer ferroelectric transistors," Applied Physics Letters, 2005, vol. 87, pp. 092903-1-092903-3. (Austrian priority application).

* cited by examiner

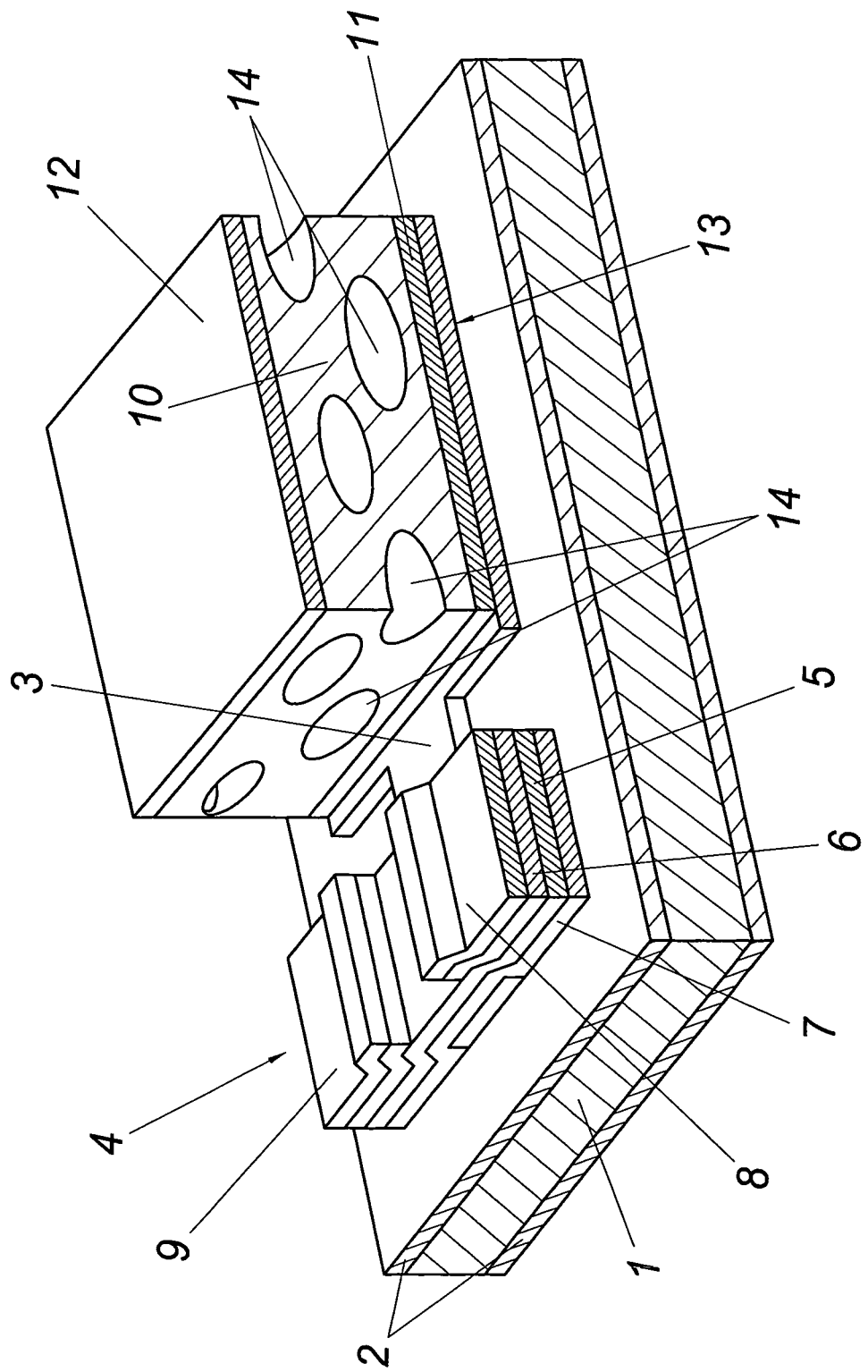

FERROIC SENSOR HAVING TINI-FILM FIELD-EFFECT TRANSISTOR AND FERROIC LAYER APPLIED TO SUBSTRATE

CROSS REFERENCE TO RELATED APPLICATIONS

This application is the National Stage of PCT/AT2007/000032 filed on Jan. 25, 2007, which claims priority under 35 U.S.C. §119 of Austrian Application No. A 114/2006 filed on Jan. 26, 2006. The international application under PCT article 21(2) was not published in English.

FIELD OF THE INVENTION

The invention relates to a ferroic component, comprising a ferroic layer arranged between two electrodes, a thin-film field-effect transistor whose gate electrode forms one of the two electrodes of the ferroic layer which is joined to the gate electrode via an intermediate layer acting as a bonding agent.

DESCRIPTION OF THE PRIOR ART

Ferroics are understood to be materials whose symmetry can be changed by temperature or pressure as is the case for example in ferroelectric and/or ferromagnetic components. Ferroic components thus show ferromagnetic, ferroelectric or coupled ferromagnetic/ferroelectric functions. It is known in a ferroelectric component (DE 38 23 910 C2) for example which can be used as a pressure or temperature sensor to apply a ferroelectric layer such as a film made of polyvinylidene fluoride to a semiconductor substrate with the help of a thermoplastic intermediate layer, preferably made of polyisobutylene, which substrate is provided with the source and drain electrodes and a gate electrode on the side facing the ferroelectric layer for forming a field-effect transistor. Since the ferroelectric layer is applied to the gate electrode via the dielectric intermediate layer made of a thermoplastic material, the gate electrode forms one of two electrodes between which the ferroelectric layer is located. This not only enables a respective polarization of the ferroelectric layer, but also a triggering of the field-effect transistor as a result of the piezoelectric and pyroelectric effects of the ferroelectric layer, which is coupled in a capacitive manner with the gate electrode via the dielectric intermediate layer. The structure of these ferroelectric components requires a semiconductor substrate of the field-effect transistor supporting the ferroelectric layer, which limits the application of such components to substantially rigid constructions, even if flexible ferroelectric layers are assumed. Flexible layers with quasi-ferroelectric properties are obtained when cellular polymers are charged permanently internally by microplasma discharges. Foamed, non-polar polymers are especially suitable for such charging, which are outstanding insulators. The precondition for an internal charging is an ionization of the gas in the cellular cavities, so that free charge carriers in the form of electrons and ions are present which are separated according to their polarity upon applying an external electric field and settle on the walls of the cavities as charge layers. Through a polarization in the opposite direction of the external electric field, it is also possible to reverse polarity of the charge layers, so that conditions are obtained which are similar in respect of ferroelectric properties. Piezoelectric effects can also be determined, namely as a result of the different elastic properties of the gas in the cavities of the cellular polymer and the polymer per se. Very low dynamic piezoelectric coefficients $d_{31}$ of 2 pC/N are thus obtained advantageously and a large piezoelectric coefficient $d_{33}$ of of 250 pC/N for example, so that the electrical voltages caused by the shearing forces can often be neglected and the pressure loads to be measured can be converted with a comparatively high resolution into electric voltages. Since cellular polymers lead to flexible layers, they represent an advantageous precondition for flexible pressure-sensitive sensors for example. However, the known configuration of ferroelectric components is not suitable to utilize the flexibility of layers made of cellular polymers for the flexible arrangement of such components.

SUMMARY OF THE INVENTION

The invention is thus based on the object of arranging a ferroic component of the kind mentioned above in such a way that it can be made accessible to a field of use as a result of its flexibility that requires flexible sensor elements.

This object is achieved by the invention in such a way that the thin-film field-effect transistor on the one hand and the ferroic layer which consists of an internally charged cellular polymer on the other hand are applied to the substrate which is arranged as a flexible plastic film, optionally by interposing an insulating layer therebetween.

Since as a result of this measure the semiconductor layer of the thin-film field effect transistor does not need to be used as carrier substrate for the ferroic layer and instead a separate flexible film is used for this purpose on which the ferroic layer on the one hand and the field-effect transistor joined to the ferroic layer on the other hand are applied, all preconditions for a flexible ferroic component are fulfilled when the ferroic layer per se has respective flexibility, as is the case when using internally charged cellular polymers. With the application of the semiconductor layer of the thin-film field-effect transistor to a carrier substrate, a layer thickness which is sufficiently low for the required bending behaviour can also be ensured for this semiconductor layer. A ferroic component in accordance with the invention can thus be used in the form of a flexible coated film in different applications as a switching element, a pressure sensor, a microphone or the like.

The coupling of the ferroic layer to the gate electrode can occur in the known manner via a dielectric intermediate layer as a bonding agent. This capacitive coupling is especially suitable for cellular polymers with distinct piezoelectric effects. When cellular polymers with low piezoelectric effects are used, which are internally charged polymers which supply low electric voltages, the intermediate layer between the gate electrode and the ferroic layer made of an internally charged cellular polymer can also be arranged as an electrically conductive layer in order to trigger the thin-film field-effect transistor via the ferroic layer.

Especially simple constructional conditions are obtained when the thin-film field effect transistor is applied with the gate electrode on the side facing the substrate and with the source and drain electrode on the side averted from the substrate. In such a construction, the gate electrode can be applied first to the carrier substrate, thus considerably simplifying the capacitive coupling of the ferroic layer to the gate electrode via a dielectric intermediate layer. The connections of the source and drain electrodes can be produced in a similarly advantageous manner, which are situated on the side of the semiconductor layer of the thin-film field-effect transistor which is opposite of the gate electrode.

BRIEF DESCRIPTION OF THE DRAWING

The subject matter of the invention is shown in the drawing by way of example. It shows a ferroic component in accordance with the invention in a simplified schematic diagram.

DESCRIPTION OF THE PREFERRED EMBODIMENT

The illustrated ferroic component has a flexible plastic film 1 which is 50 μm thick and made of a thermostable polyimide (diphenyloxide-pyromellithimide) which despite its electrically insulating properties is covered on both sides with a silicon nitride layer 2 in a thickness of 300 nm. An aluminum/chromium layer with a thickness of 100/10 nm is applied onto this insulated plastic film 1 additionally insulated on both sides as a gate electrode 3 of a thin-film field-effect transistor 4 whose semiconductor layer is composed of a layer 5 of a non-doped amorphous hydrogen-containing silicon layer with a thickness of 150 nm and a layer 6 made of an n*-doped amorphous hydrogen-containing silicon layer with a thickness of 50 nm. A silicon nitride layer with a thickness of 290 nm is provided as a dielectric layer 7 between the gate electrode 3 and the semiconductor layer 5, 6. The source electrode 8 and the drain electrode 9 each consist of a three-layered layer made of chromium/aluminum/chromium with a thickness of 10/100/10 nm, thus leading to channel dimensions for the thin-film field-effect transistor of approx. 40×370 μm. Technologically comparable solutions can be obtained by using other thin-film transistor techniques such as those on the basis of organic semiconductors.

A ferroic layer 10 made of an internally charged cellular polymer is applied to the gate electrode 3 via a dielectric intermediate layer 11. Said dielectric intermediate layer 11 is used on the one hand as a bonding agent and on the other hand for capacitive coupling of the ferroic layer 10 to the gate electrode 3 of the thin-film field-effect transistor 4. The gate electrode 3 also forms one of two electrodes 12, 13 between which the ferroic layer 10 can be exposed for polarization or for re-polarizing an electric direct field. As a result of such an electric field, the free charge carriers which are present in the schematically indicated cavities 14 are separated from each other and settle on the mutually opposite inside surfaces of the cavities 14, thus establishing the quasi-ferroelectric properties. The elasticity of the gases in the cavities 14 and the polymer of the ferroic layer 10 cause in cooperation with the mutually separated charge carriers a piezoelectric effect, so that changes in field strength as a result of pressure loads of the ferroic layer 10 can be converted in a sensitive manner via the thin-film field-effect transistor 4 into electrical signals. The flexible plastic film 1 as the supporting substrate enables a flexible component in combination with the flexible ferroic layer 10 since the thin-film field-effect transistor 4 applied to the plastic film 1 need not assume any supporting function for the ferroic layer 10. The arrangement of the gate electrode 3 on the side of the semiconductor layer 5, 6 facing the plastic film 1 and the source and drain electrode 8, 9 on the opposite side thereof also ensures an arrangement of the ferroic component which is advantageous for production, which applies in respect of the required flexibility of the entire component because the mechanical forces occurring in a bending load can be kept at a comparatively low level.

It is understood that the invention is not limited to the illustrated embodiment. The dielectric intermediate layer 11 between the gate electrode 3 and the ferroic layer 10 can be replaced for example by an electrically conductive layer when the voltages supplied by the ferroic layer 10 are comparatively low.

The invention claimed is:

1. A ferroic sensor comprising:
    a first electrode comprising a gate electrode;
    a second electrode;
    a ferroic layer comprising an internally charged polymer arranged between the first and second electrodes;
    a thin-film field-effect transistor having the gate electrode;
    an intermediate layer acting as a bonding agent and joining the ferroic layer to the gate electrode; and
    a substrate used as a support and comprising a flexible plastic film;
    wherein the thin-film field-effect transistor and the ferroic layer are applied laterally next to each other onto the flexible plastic film.

2. The ferroic sensor according to claim 1, wherein the intermediate layer comprises a dielectric layer.

3. The ferroic sensor according to claim 1, wherein the intermediate layer comprises an electrically conductive layer.

4. The ferroic sensor according to claim 1, wherein the thin-film field effect transistor has:
    a first side facing the substrate;
    a second side averted from the substrate; and
    source and drain electrodes on the second side;
    wherein the gate electrode is on the first side.

5. The ferroic sensor according to claim 1, further comprising an insulating layer interposed between the substrate and the thin-film field-effect transistor and between the substrate and the ferroic layer.

\* \* \* \* \*

UNITED STATES PATENT AND TRADEMARK OFFICE
CERTIFICATE OF CORRECTION

PATENT NO. : 8,461,636 B2  
APPLICATION NO. : 12/223241  
DATED : June 11, 2013  
INVENTOR(S) : Bauer et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1056 days.

Signed and Sealed this
Eighth Day of September, 2015

Michelle K. Lee
*Director of the United States Patent and Trademark Office*